United States Patent
Zuo

(10) Patent No.: US 11,410,874 B2
(45) Date of Patent: Aug. 9, 2022

(54) METHOD FOR FORMING SEMICONDUCTOR STRUCTURE

(71) Applicant: CHANGXIN MEMORY TECHNOLOGIES, INC., Hefei (CN)

(72) Inventor: Quan Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/599,731

(22) PCT Filed: May 28, 2021

(86) PCT No.: PCT/CN2021/096960
§ 371 (c)(1),
(2) Date: Sep. 29, 2021

(87) PCT Pub. No.: WO2022/100066
PCT Pub. Date: May 19, 2022

(65) Prior Publication Data
US 2022/0148913 A1    May 12, 2022

(30) Foreign Application Priority Data

Nov. 10, 2020 (CN) .......................... 202011246378.1

(51) Int. Cl.
*H01L 21/768* (2006.01)
*B05D 7/00* (2006.01)
*H01F 7/20* (2006.01)

(52) U.S. Cl.
CPC .......... *H01L 21/76808* (2013.01); *B05D 7/54* (2013.01); *H01F 7/20* (2013.01)

(58) Field of Classification Search
CPC ......... H01L 21/76808; H01L 21/76802; H01L 21/7681; H01L 21/76811
See application file for complete search history.

(56) References Cited

U.S. PATENT DOCUMENTS

| 6,471,830 B1 * | 10/2002 | Moslehi ................ C23C 14/358 204/192.12 |
| 9,512,534 B2 | 12/2016 | Kondo et al. |
| 2004/0023497 A1 | 2/2004 | Pan et al. |

FOREIGN PATENT DOCUMENTS

| CN | 1414613 A | 4/2003 |
| CN | 101079408 A | 11/2007 |
| CN | 101892501 A | 11/2010 |
| CN | 102054761 A | 5/2011 |
| CN | 103606532 A | 2/2014 |
| KR | 20070069651 | * 7/2007 |

OTHER PUBLICATIONS

International Search Report and English Translation as cited in PCT/CN2021/096960 dated Jul. 28, 2021, 10 pages.
Written Opinion and English Translation as cited in PCT/CN2021/096960 dated Jul. 28, 2021, 7 pages.

* cited by examiner

*Primary Examiner* — Thanhha S Pham
(74) *Attorney, Agent, or Firm* — Cooper Legal Group, LLC

(57) ABSTRACT

The present disclosure discloses a method for forming a semiconductor structure. The method for forming a semiconductor structure includes: providing a base; forming a dielectric layer on the base; forming one or more openings in the dielectric layer; and forming an anti-reflective coating in the one or more openings. When forming the anti-reflective coating, alternating current is applied around the base.

12 Claims, 4 Drawing Sheets

METHOD FOR FORMING SEMICONDUCTOR STRUCTURE

CROSS-REFERENCE TO RELATED APPLICATIONS

The present disclosure claims the priority to Chinese Patent Application 202011246378.1, titled "METHOD FOR FORMING SEMICONDUCTOR STRUCTURE", filed to the State Intellectual Property Office of People's Republic of China on Nov. 10, 2020, which is incorporated herein by reference in its entirety.

TECHNICAL FIELD

The present disclosure relates to, but is not limited to, a method for forming a semiconductor structure.

BACKGROUND

With the continuous development of integrated circuit manufacturing processes, the increasingly reduced feature size of semiconductor chips, the increasingly increased number of transistors in a chip, and the increasingly powerful functions, the metal wirings of the chip are arranged in more layers while becoming thinner. This leads to an increasing influence of the resistance-capacitance (RC) delay on the chip speed, which is caused by the resistance of the wirings and the capacitance of the dielectric layer between the wirings. This influence even exceeds the gate delay that determines the speed of the transistor itself.

In order to solve the problem of resistance-capacitance delay (RC delay), generally, low-dielectric materials (with a dielectric constant of less than 3.0) that meet the IC process are used so that the electrical constant of the dielectric layer between the multiple metal wirings is lower than that of silicon, thereby reducing the parasitic capacitance; or, copper, instead of aluminum, is used as the conducting material of the wirings in the semiconductor element to reduce resistance. Compared with aluminum, copper has the advantages of low resistivity, high melting point and high electromigration resistance and is applicable to higher current density; and because copper may be made thinner, the use of copper can reduce capacitance and power consumption and can increase the packaging density of the element.

Since copper is difficult to be etched, the conventional etching processes used to form aluminum metal wiring is not suitable for copper. For this reason, a new wiring method called dual Damascene structure was developed. The so-called dual Damascene structure process is to form interconnected trenches and vias in the dielectric layer, then deposit copper in the interconnected trenches and vias by electroplating or chemical copper plating, and then grind the overfilled copper by chemical mechanical polishing (CMP).

During the manufacturing process of the existing dual Damascene structure, there is a problem that the anti-reflective coating cannot fill the vias or openings well, which affects the morphology of the trenches.

SUMMARY

The present disclosure provides a method for forming a semiconductor structure, comprising:
providing a base;
forming a dielectric layer on the base;
forming one or more openings in the dielectric layer; and
forming an anti-reflective coating in the one or more openings, alternating current being applied around the base when the anti-reflective coating is formed.

The technical solution of the present disclosure has the following advantages.

The method for forming a semiconductor structure in the present disclosure comprises: providing a base; forming a dielectric layer on the base; forming one or more openings in the dielectric layer; and forming an anti-reflective coating in the one or more openings. When forming the anti-reflective coating, alternating current is applied around the base. Alternating current is applied around the base when the anti-reflective coating is formed, and the alternating current will generate a magnetic field force perpendicular to the surface of the base. Since some particles in the anti-reflective coating material are weakly charged, when there are defects such as holes and bubbles in the anti-reflective coating material filled in the one or more openings, the weakly charged particles in the anti-reflective coating material can squeeze the defects such as holes and bubbles due to the magnetic field force, so that the defects such as holes and bubbles may decrease or disappear. Thus, the formed anti-reflective coating can fill the one or more openings well. Subsequently, when part of the thickness of the dielectric layer is removed by etching to form a trench communicated with the one or more openings (or one or more vias) or when the anti-reflective coating is directly removed by etching to re-expose the one or more openings, the anti-reflective coating filled in the one or more openings will not affect the etching process, so that the formed trench or the re-exposed one or more openings have a good sidewall morphology. Furthermore, since alternating current, the direction of which changes at intervals, is applied, the direction of the generated magnetic field force changes accordingly. As a result, the weakly charged particles in the anti-reflective coating material can squeeze the defects such as holes and bubbles sequentially from above and below due to the magnetic field force, so that the defects such as holes and bubbles may decrease or disappear faster or more effectively.

After reading and understanding the drawings and detailed description, other aspects may be understood.

BRIEF DESCRIPTION OF THE DRAWINGS

The accompanying drawings, which are incorporated in and form a part of this specification, illustrate embodiments of the present disclosure and explain, together with the description, the principles of the present disclosure. In these drawings, like reference numerals identify like elements. The drawings to be described below are some, but not all, embodiments of the present disclosure. Other drawings may be obtained by a person of ordinary skill in the art in accordance with those drawings without paying any creative effort.

REFERENCE NUMERALS

Figure 1:
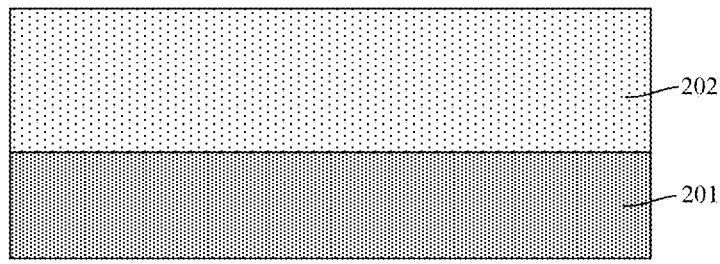
FIG. 1 is a schematic cross-sectional structure diagram of a base and a dielectric layer according to an embodiment of the disclosure.

201: base; 202: dielectric layer; 203: opening; 205: anti-reflective coating; 206: hole or bubble defect; 207: photoresist layer; 208: second opening; 209: trench; 210: dual Damascene structure; 31: coating chamber; 301: chamber wall; 302: coil; 303: magnetic field force; 304: chuck.

DETAILED DESCRIPTION

To make the purposes, technical solutions and advantages of the embodiments of the present disclosure clearer, the technical solutions in the embodiments of the present disclosure will be described clearly and completely with reference to the drawings in the embodiments of the present disclosure. Apparently, the embodiments to be described are some, but not all, embodiments of the present disclosure. Based on the embodiments of the present disclosure, all other embodiments obtained by a person of ordinary skill in the art without paying any creative effort should be included in the protection scope of the present disclosure. It is to be noted that the embodiments of the present disclosure and features in the embodiments may be combined if not conflict.

As described in the background, during the manufacturing process of the existing dual Damascene structure, there is a problem that the anti-reflective coating cannot fill the vias or openings well, which affects the morphology of the trenches.

As an existing method for fabricating a dual Damascene structure, the Via First method is used, comprising: providing a base; forming a dielectric layer on the base; forming a via (or opening) in the dielectric layer, the via being filled with an anti-reflective coating; forming a patterned photoresist layer on the dielectric layer, the patterned photoresist layer having an opening from which the via and part of the dielectric layer around the via are exposed; by using the patterned photoresist layer as a mask, etching to remove part of the thickness of the dielectric layer and remove the anti-reflective coating, and forming a trench communicated with the via in the dielectric layer; and filling metal in the trench and the via to form a dual Damascene structure.

Due to the high aspect ratio of the existing via, when the anti-reflective coating filling the via is formed by spin coating, defects such as holes or bubbles may be formed in the anti-reflective coating formed in the via, so that the via cannot be filled well. When the dielectric layer is subsequently etched to form a trench, the anti-reflective coating with defects such as air gaps or bubbles will affect the uniformity of the etching, thus affecting the morphology of the formed trench. Poor morphology of the trench will affect the electrical properties of the dual Damascene structure formed in the trench and via.

Hereinafter, a method for forming a semiconductor structure according to the present disclosure will be described with reference to the accompanying drawings by specific implementations.

The present disclosure provides a method for forming a semiconductor structure. The method for forming a semiconductor structure comprises: providing a base; forming a dielectric layer on the base; forming an opening in the dielectric layer; and forming an anti-reflective coating in the opening. When forming the anti-reflective coating, alternating current is applied around the base. Alternating current is applied around the base when the anti-reflective coating is formed, and the alternating current will generate a magnetic field force perpendicular to the surface of the base. Since some particles in the anti-reflective coating material are weakly charged, when there are defects such as holes and bubbles in the anti-reflective coating material filled in the opening, the weakly charged particles in the anti-reflective coating material can squeeze the defects such as holes and bubbles due to the magnetic field force, so that the defects such as holes and bubbles may decrease or disappear. Thus, the formed anti-reflective coating can fill the opening well. Subsequently, when part of the thickness of the dielectric layer is removed by etching to form a trench communicated with the opening (or via) or when the anti-reflective coating is directly removed by etching to re-expose the opening, the anti-reflective coating filled in the opening will not affect the etching process, so that the formed trench or the re-exposed opening has a good sidewall morphology. Furthermore, since alternating current, the direction of which changes at intervals, is applied, the direction of the generated magnetic field force changes accordingly. As a result, the weakly charged particles in the anti-reflective coating material can squeeze the defects such as holes and bubbles sequentially from above and below due to the magnetic field force, so that the defects such as holes and bubbles may decrease or disappear faster or more effectively.

When describing the embodiments of the present disclosure in detail, for ease of description, the schematic diagrams will not be partially enlarged according to a general scale, and the schematic diagrams are only examples and not intended to limit the protection scope of the present disclosure. In addition, the three-dimensional dimensions of length, width and depth should be included in the actual production.

Referring to FIG. 1, a base 201 is provided. A dielectric layer 202 is formed on the base 201.

In an embodiment of the present disclosure, the base 201 comprises a semiconductor substrate and an underlying dielectric layer on the semiconductor base. Semiconductor devices, such as transistors, are formed in the semiconductor substrate. There are metal connecting pads in the underlying dielectric layer, and the metal connecting pads may be electrically connected to the semiconductor devices in the semiconductor substrate.

The semiconductor substrate may be made of silicon (Si), germanium (Ge), silicon germanium (GeSi), or silicon carbide (SiC); or may be made of silicon-on-insulator (SOI) or germanium-on-insulator (GOI); or may be made of other materials, for example III-V group compounds such as gallium arsenide. In this embodiment, the semiconductor substrate is made of silicon. The semiconductor substrate is doped with certain impurity ions as required, and the impurity ions may be N-type impurity ions or P-type impurity ions.

In other embodiments of the present disclosure, the base 201 may be directly a semiconductor substrate, and a dielectric layer is formed on the surface of the semiconductor substrate.

The dielectric layer 202 is formed on the base 201 by a deposition process, and the thickness of the dielectric layer 202 may be 2000-3000 angstroms. The dielectric layer 202 may be made of silicon oxide, silicon nitride, silicon oxynitride, fluorine-doped silica glass (FSG), a low dielectric constant ($K \leq 3.5$) material, other suitable materials and/or a combination thereof. In an embodiment, the low dielectric constant material may be SiCOH.

Figure 2:
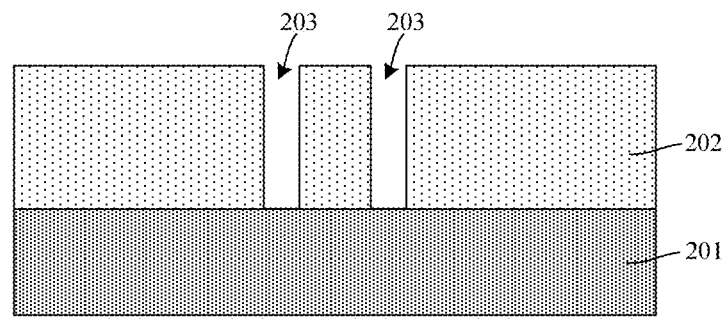
FIG. 2 is a schematic cross-sectional structure diagram of a semiconductor structure, when an opening is formed in a dielectric layer, during the formation of the semiconductor structure according to an embodiment of the present disclosure.
Figure 3:
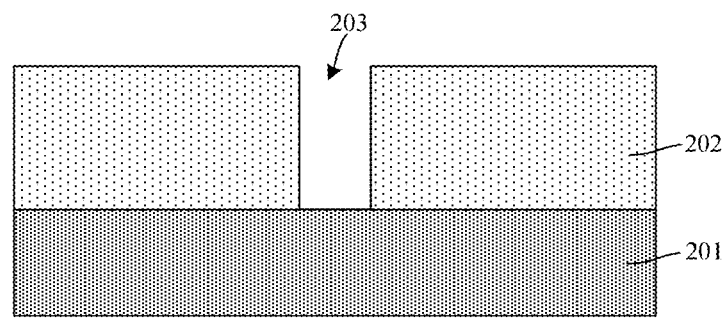
FIG. 3 is a schematic cross-sectional structure diagram of a semiconductor structure, when an opening is formed in a dielectric layer, during the formation of the semiconductor structure according to an embodiment of the present disclosure.

Referring to FIG. 2 or FIG. 3, an opening 203 is formed in the dielectric layer 202.

The opening 203 is an opening with a high aspect ratio (greater than 2:1). In some embodiments of the present disclosure, the dielectric layer 202 is etched by an anisotropic dry etching process (which may be a plasma etching process), the opening 203 is formed in the dielectric layer 202, and the opening 203 is located above the metal connecting pad.

In some embodiments of the present disclosure, referring to FIG. 2, the opening 203 is a via formed in the dielectric layer 202, and there is one or more (greater than or equal to 2) vias. The via is subsequently used as part of the dual Damascene opening. The via may run through the thickness of the dielectric layer 202, or the depth of the via is less than the thickness of the dielectric layer 202. Subsequently, the dual Damascene opening may be filled with metal to form a dual Damascene structure 210.

In some embodiments of the present disclosure, referring to FIG. 3, the opening 203 is located in a trench in the dielectric layer 202. Subsequently, the trench is filled with a conducting material to form a conductive connection structure (for example a plug).

Figure 4:
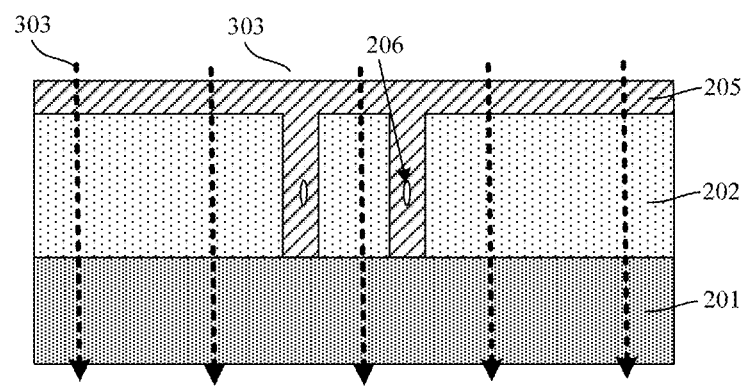
FIG. 4 is a schematic cross-sectional structure diagram of a semiconductor structure, when an anti-reflective coating is formed in an opening, during the formation of the semiconductor structure according to an embodiment of the present disclosure.
Figure 5:
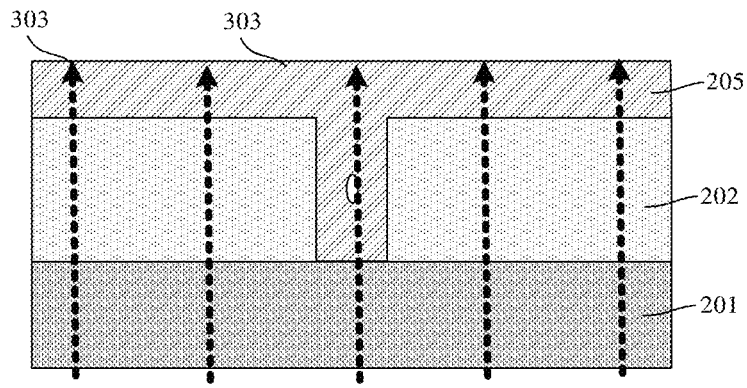
FIG. 5 is a schematic cross-sectional structure diagram of a semiconductor structure, when an anti-reflective coating is formed in an opening, during the formation of the semiconductor structure according to another embodiment of the present disclosure.

Referring to FIG. 4 that is on the basis of FIG. 2 or FIG. 5 that is on the basis of FIG. 3, an anti-reflective coating 205 is formed in the opening 203 (referring to FIG. 2 or FIG. 3). When the anti-reflective coating 205 is used, alternating current is applied around the base 201.

The purpose of forming the anti-reflective coating 205 is as follows: on one hand, when other material layers (for example a photoresist layer or a mask layer) need to be formed on the dielectric layer 202 later, the other material layers have a flat surface; and on the other hand, during the subsequent formation of a photoresist layer on the dielectric layer 202, when the photoresist layer is exposed, the reflection of light may be reduced, the dimensional accuracy of the pattern formed in the photoresist layer may be improved, and a more effectively sidewall topography may be maintained.

In some embodiments of the present disclosure, the anti-reflective coating 205 may be a bottom anti-reflective coating (BARC).

Figure 6:
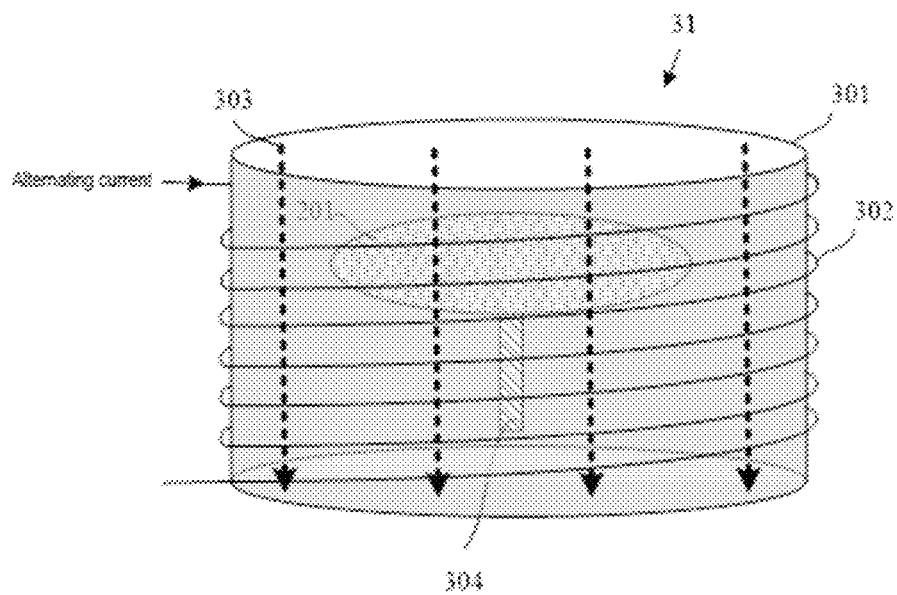
FIG. 6 is a schematic view of forming the anti-reflective coating in the coating chamber during the formation of the semiconductor structure according to an embodiment of the present disclosure.

In some embodiments of the present disclosure, referring to FIG. 6, the formation of the anti-reflective coating 205 is performed in a coating chamber 31, the coating chamber 31 has a chuck 304 that catches up the base 201, the coating chamber 31 is surrounded by a chamber wall 301, a coil 302 surrounding the chuck 304 is provided on a sidewall of the chamber wall 301, and alternating current is applied to the coil 302.

Figure 7:
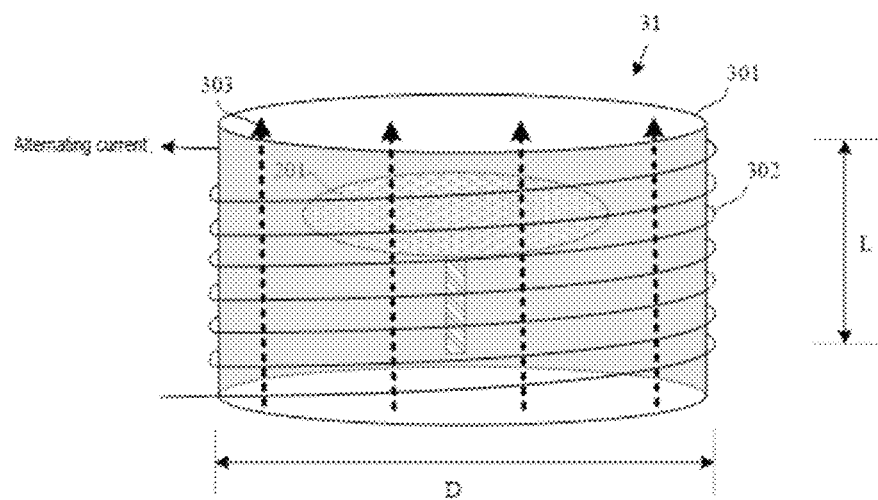
FIG. 7 is a schematic view of forming the anti-reflective coating in the coating chamber during the formation of the semiconductor structure according to another embodiment of the present disclosure.

The coating chamber 31 is a part of the coating device. Before the anti-reflective coating 205 is formed in the opening 203 of the dielectric layer 202 of the base 201, the base 201 on which the dielectric layer 202 is formed is placed on the chuck 304 in the coating chamber 31, and the chuck 304 fixes the base 201 by vacuum adsorption. The chuck 304 also controls the rotation of the base 201. When the base 201 rotates, a (liquid) anti-reflective coating material is sprayed onto the base 201. Meanwhile, alternating current is applied to the coil 302, and the alternating current generates a magnetic field force 303 perpendicular to the surface of the base 201 in the coating chamber 31, until the anti-reflective coating 205 is formed in the opening 203 (referring to FIG. 2 or FIG. 3). Alternating current is applied around the base 201 (or the chuck 304) when the anti-reflective coating 205 is formed, and the alternating current will generate a magnetic field force 303 perpendicular to the surface of the base 201 (in the coating chamber 31). Since some particles in the anti-reflective coating material are weakly charged, when there are defects 206 such as holes and bubbles in the anti-reflective coating material filled in the opening 203, the weakly charged particles in the anti-reflective coating material can squeeze the defects 206 such as holes and bubbles due to the magnetic field force 303, so that the defects 206 such as holes and bubbles may decrease or disappear. Thus, the formed anti-reflective coating 205 can fill the opening 203 well. Subsequently, when part of the thickness of the dielectric layer 202 is removed by etching to form a trench communicated with the opening (or via) or when the anti-reflective coating 205 is directly removed by etching to re-expose the opening 203, the anti-reflective coating 205 filled in the opening 203 will not affect the etching process, so that the formed trench or the re-exposed opening 203 has a good sidewall morphology. Furthermore, since alternating current, the direction of which changes at intervals, is applied, the direction of the generated magnetic field force 303 changes accordingly. As a result, the weakly charged particles in the anti-reflective coating material can squeeze the defects 206 such as holes and bubbles sequentially from above and below due to the magnetic field force 303, so that the defects 206 such as holes and bubbles may decrease or disappear faster or more effectively. Specifically, when the direction of the alternating current in the coil 302 is as indicated by the arrow in FIG. 6, correspondingly, the generated magnetic field force 303 faces downward. When the direction of the alternating current in the coil 302 is as indicated by the arrow in FIG. 7, correspondingly, the generated magnetic field force 303 faces upward. FIGS. 4 and 5 illustrate the magnetic field force 303 in two different directions. FIG. 4 illustrates that the generated magnetic field force 303 is perpendicular to the surface of the base 201 downward, and FIG. 5 illustrates that the generated magnetic field force 303 is perpendicular to the surface of the base 201 upward.

In some embodiments of the present disclosure, the alternating current of the coil has a voltage of 180V to 380V, for example 180V, 200V, 250V, 280V, 300V, 350V, 380V, and a frequency of 0.5 Hz to 50 Hz, for example 0.5 Hz, 1 Hz, 2 Hz, 5 Hz, 10 Hz, 20 Hz, 30 Hz, 40 Hz, 50 Hz. Thus, when the anti-reflective coating 205 is formed, defects 206 such as holes and bubbles in the anti-reflective coating material filled in the opening 203 decrease or disappear at improved speed and efficiency. In a specific embodiment, the alternating current has a voltage of 180V to 380V and a frequency of 0.5 Hz to 50 Hz. Therefore, the current changes its direction every 2 seconds. Correspondingly, the generated magnetic field force 303 changes its direction every 2 seconds to 0.5 seconds (for example, the magnetic field force 303 changes from a direction perpendicular to the surface of the base 201 downward to a direction perpendicular to the surface of the base 201 upward, or changes from a direction perpendicular to the surface of the base 201 upward to a direction perpendicular to the surface of the base 201 downward). Therefore, the current direction change is neither too fast nor too slow. Accordingly, the weakly charged particles in the anti-reflective coating material can squeeze the defects 206 such as holes and bubbles sequentially from above and below due to the magnetic field force 303. Thus, the defects 206 such as holes and bubbles in the anti-reflective coating material decrease or disappear at improved speed and efficiency. In some embodiments of the present disclosure, the number of turns of the coil is greater than 100, the diameter D (referring to FIG. 7) of the coil is greater than that of the base 201 on the chuck, and the distribution length L (referring to FIG. 7) of the coil 302 along the sidewall of the chamber wall 301 of the coil 302 is greater than the total thickness of the chuck 304 and the base 201 on the chuck 304. In this way, when the anti-reflective coating 205 is formed, the defects such as holes and bubbles in the anti-reflective coating material filled in the opening 203 may decrease or disappear faster or more effectively. In a specific embodiment of the present disclosure, the material of the coil 302 may be copper wire or aluminum wire, and the coil 302 may be disposed on the inner wall surface or outer wall surface of the chamber wall 301 or in the chamber wall 301. In other embodiments, the coil 302 may be disposed at other suitable positions, as long as the coil surrounds the base 201 when the anti-reflective coating 205 is formed on the base 201.

In some embodiments of the present disclosure, the distribution length L of the coil 302 is 180 mm to 500 mm, and the diameter D of the coil 302 is 350 mm to 800 mm. It should be noted that, in some embodiments, when the anti-reflective coating 205 is formed in the opening 203, the formed anti-reflective coating 205 may be formed on the surface of the dielectric layer 202.

Figure 8:
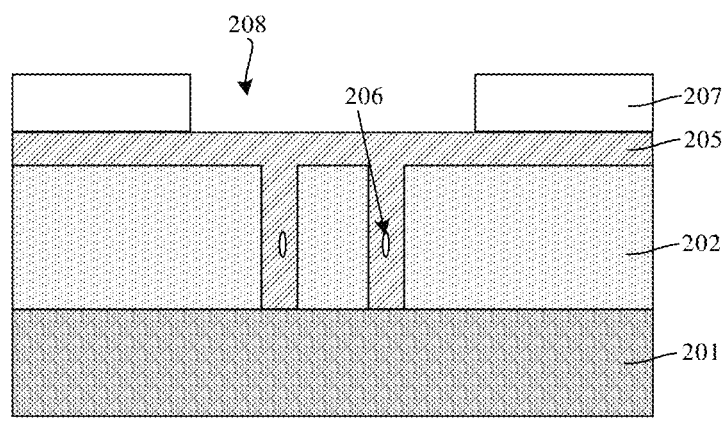
FIG. 8 is a schematic cross-sectional structure diagram of a semiconductor structure, when a photoresist layer is formed on a dielectric layer, during the formation of the semiconductor structure according to an embodiment of the present disclosure.
Figure 9:
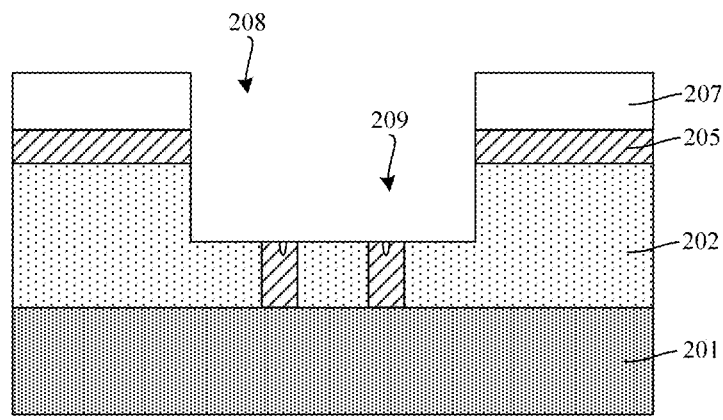
FIG. 9 is a schematic cross-sectional structure diagram of a semiconductor structure, when a trench is formed in a dielectric layer, during the formation of the semiconductor structure according to an embodiment of the present disclosure.
Figure 10:
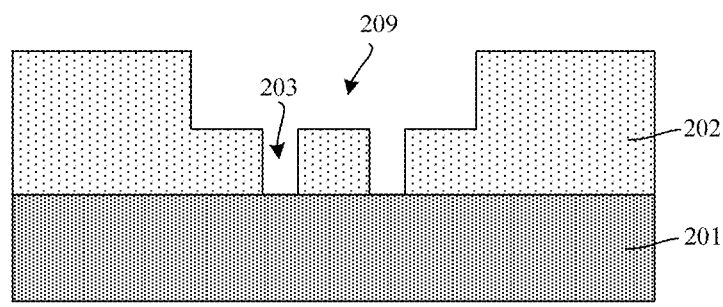
FIG. 10 is a schematic cross-sectional structure diagram of a semiconductor structure, when the anti-reflective coating is removed after the trench is formed in the dielectric layer, during the formation of the semiconductor structure according to an embodiment of the present disclosure.

In some embodiments of the present disclosure, referring to FIG. 8 that is on the basis of FIG. 6, the opening 203 is a via located in the dielectric layer 202; after forming the anti-reflective coating 205 in the opening 203 (i.e., the via), the method for forming a semiconductor structure further comprises: forming a patterned photoresist layer 207 on the dielectric layer 202, the patterned photoresist layer 207 having a second opening from which the via and part of the dielectric layer 202 around the via 208 are exposed; referring to FIGS. 9 and 10, by using the patterned photoresist layer 207 as a mask, etching to remove part of the thickness of the dielectric layer 202 along the second opening 208 and remove the anti-reflective coating 205, and forming a trench 209 communicated with the via (i.e., the opening 203) in the dielectric layer 202.

Figure 11:
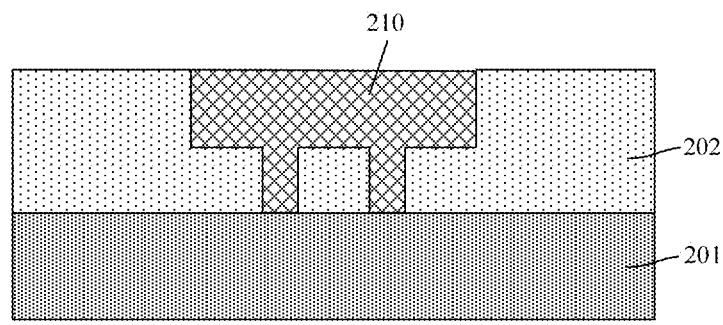
FIG. 11 is a schematic cross-sectional structure diagram of a semiconductor structure, when a dual Damascene structure is formed, during the formation of a semiconductor structure according to an embodiment of the present disclosure.

Referring to FIG. 11, a conducting material is filled in the trench 209 and the via (i.e., the opening 203) to form a dual Damascene structure 210.

The conducting material is metal and the metal comprises copper.

In other embodiments of the present disclosure, after the anti-reflective coating 205 is formed in the opening 203, the method for forming a conductor structure further comprises: removing the anti-reflective coating 205 and re-exposing the opening 203; and filling the opening 203 with a conducting material to form a conductive connection structure.

Those skilled in the art will readily think of other implementations of the present disclosure by considering the specification and practicing the disclosure disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

It should be understood that the present disclosure is not limited to the precise structures that have been described above and shown in the drawings, and various modifications and changes may be made without departing from its scope. The scope of the present disclosure is defined only by the appended claims.

INDUSTRIAL APPLICABILITY

In the method for forming a semiconductor structure in the present disclosure, alternating current is applied around the base when the anti-reflective coating is formed, and the alternating current will generate a magnetic field force perpendicular to the surface of the base. Since alternating current, the direction of which changes at intervals, is applied, the direction of the generated magnetic field force changes accordingly. Since some particles in the anti-reflective coating material are weakly charged, when there are defects such as holes and bubbles in the anti-reflective coating material filled in the opening, the weakly charged particles in the anti-reflective coating material can squeeze the defects such as holes and bubbles sequentially from above and below due to the magnetic field force, so that the defects such as holes and bubbles may decrease or disappear faster or more effectively. Thus, the formed anti-reflective coating can fill the opening well.

The invention claimed is:

1. A method for forming a semiconductor structure, comprising:
   providing a base;
   forming a dielectric layer on the base;
   forming one or more openings in the dielectric layer; and
   forming an anti-reflective coating in the one or more openings, alternating current being applied around the base when the anti-reflective coating is formed, and the alternating current generating a magnetic field force perpendicular to a surface of the base, defects of holes and bubbles in the anti-reflective coating in the one or more opening being squeezed sequentially from above and below by weakly charged particles in the anti-reflective coating due the generated magnetic force.

2. The method for forming the semiconductor structure according to claim 1, wherein the formation of the anti-reflective coating is performed in a coating chamber, the coating chamber has a chuck that catches up the base, the coating chamber is surrounded by a chamber wall, and a coil surrounding the chuck is provided on a sidewall of the chamber wall.

3. The method for forming the semiconductor structure according to claim 2, wherein, when the anti-reflective coating is formed, the base is placed on the chuck, and the chuck controls rotation of the base; when the base rotates, a material for the anti-reflective coating is sprayed onto the base; and the alternating current is applied to the coil, and the alternating current generates the magnetic field force perpendicular to the surface of the base in the coating chamber.

4. The method for forming the semiconductor structure according to claim 3, wherein the alternating current has a voltage of 180V to 380V and a frequency of 0.5 Hz to 50 Hz.

5. The method for forming the semiconductor structure according to claim 3, wherein a number of turns of the coil is greater than 100, a diameter of the coil is greater than a diameter of the base on the chuck, and a distribution length of the coil along the sidewall is greater than a total thickness of the chuck and the base on the chuck.

6. The method for forming the semiconductor structure according to claim 5, wherein the distribution length of the coil is 80 mm to 500 mm, and the diameter of the coil is 350 mm to 800 mm.

7. The method for forming the semiconductor structure according to claim 4, wherein a number of turns of the coil is greater than 100, a diameter of the coil is greater than a diameter of the base on the chuck, and a distribution length of the coil along the sidewall is greater than a total thickness of the chuck and the base on the chuck.

8. The method for forming the semiconductor structure according to claim 7, wherein the distribution length of the coil is 80 mm to 500 mm, and the diameter of the coil is 350 mm to 800 mm.

9. The method for forming the semiconductor structure according to claim 1, further comprising: removing the anti-reflective coating and re-exposing the one or more openings, the one or more openings are filled with a conducting material to form a conductive connection structure.

10. The method for forming the semiconductor structure according to claim 1, the one or more openings are one or more vias located in the dielectric layer; after the forming the anti-reflective coating in the one or more vias, the method for forming the semiconductor structure further comprises: etching to remove part of a thickness of the dielectric layer and remove the anti-reflective coating, forming a trench in communication with the one or more vias in the dielectric layer, and filling a conducting material in the trench and the one or more vias to form a dual Damascene structure.

11. The method for forming the semiconductor structure according to claim 10, wherein after the forming the anti-reflective coating in the one or more vias, the method for forming the semiconductor structure further comprises: forming a patterned photoresist layer above the dielectric layer, the patterned photoresist layer having a second opening, from the second opening the one or more vias and part of the dielectric layer around the one or more vias are exposed; by using the patterned photoresist layer as a mask, etching to remove part of the thickness of the dielectric layer along the second opening and remove the anti-reflective coating, and forming the trench in communication with the one or more vias in the dielectric layer.

12. The method for forming the semiconductor structure according to claim 10, wherein the base further has a connecting metal pad, and the dual Damascene structure is connected to the connecting metal pad.

* * * * *